(12) United States Patent
Kobayashi et al.

(10) Patent No.: US 9,984,892 B2
(45) Date of Patent: May 29, 2018

(54) OXIDE FILM REMOVING METHOD, OXIDE FILM REMOVING APPARATUS, CONTACT FORMING METHOD, AND CONTACT FORMING SYSTEM

(71) Applicant: Tokyo Electron Limited, Tokyo (JP)

(72) Inventors: Takashi Kobayashi, Yamanashi (JP); Seishi Murakami, Yamanashi (JP); Takashi Sakuma, Yamanashi (JP); Masahiko Tomita, Yamanashi (JP); Takamichi Kikuchi, Yamanashi (JP); Akitaka Shimizu, Yamanashi (JP); Takayuki Kamaishi, Yamanashi (JP); Einosuke Tsuda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/596,060

(22) Filed: May 16, 2017

(65) Prior Publication Data

US 2017/0338120 A1 Nov. 23, 2017

(30) Foreign Application Priority Data

May 19, 2016 (JP) .................................. 2016-100389

(51) Int. Cl.
| | |
|---|---|
| H01L 21/302 | (2006.01) |
| H01L 21/308 | (2006.01) |
| H01L 21/285 | (2006.01) |
| H01L 21/67 | (2006.01) |

(52) U.S. Cl.
CPC .... *H01L 21/3081* (2013.01); *H01L 21/28518* (2013.01); *H01L 21/28556* (2013.01); *H01L 21/67069* (2013.01)

(58) Field of Classification Search
None
See application file for complete search history.

(56) References Cited

U.S. PATENT DOCUMENTS

2017/0338120 A1* 11/2017 Kobayashi .......... H01L 21/3081

FOREIGN PATENT DOCUMENTS

WO 2007/049510 A 5/2007

* cited by examiner

*Primary Examiner* — Jack Chen
(74) *Attorney, Agent, or Firm* — Abelman, Frayne & Schwab

(57) ABSTRACT

Disclosed is a method for removing, from a target substrate having an insulating film with a predetermined pattern formed thereon, a silicon-containing oxide film formed in a silicon portion at a bottom of the pattern. The method includes: forming a carbon-based protective film on the entire surface of the insulating film including the pattern by ALD using a carbon source gas; selectively removing the carbon-based protective film on an upper surface of the insulating film and on the bottom of the pattern by an anisotropic plasma processing; removing the silicon-containing oxide film formed on the bottom of the pattern by etching; and removing a remaining portion of the carbon-based protective film.

14 Claims, 10 Drawing Sheets

OXIDE FILM REMOVING METHOD, OXIDE FILM REMOVING APPARATUS, CONTACT FORMING METHOD, AND CONTACT FORMING SYSTEM

CROSS-REFERENCE TO RELATED APPLICATIONS

This application is based on and claims priority from Japanese Patent Application No. 2016-100389 filed on May 19, 2016 with the Japan Patent Office, the disclosure of which is incorporated herein in its entirety by reference.

TECHNICAL FIELD

The present disclosure relates to an oxide film removing method, an oxide film removing apparatus, a contact forming method, and a contact forming system.

BACKGROUND

For example, in a fin-type channel field effect transistor (fin-FET) which is a three-dimensional device, a fin-type channel having a plurality of Si fins is formed on the bottom of a fine trench formed in an insulating film ($SiO_2$ film and SiN film), and a Ti film, for example, is formed as a contact metal on the source and drain portions thereof. Thus, a contact is formed. The source and drain portions of the fin-type channel are formed by epitaxially growing Si or SiGe on the Si fins. From the viewpoint of improving the contact performance, a step of removing a natural oxide film ($SiO_2$ film) formed on the surface of the source and drain portions is performed before forming the contact metal.

As a technique for removing the natural oxide film of the source and drain of the fin-FET, there has been known anisotropic etching by ionic etching.

Further, since the structure of the source and drain portions of the fin-FET is complicated, a chemical oxide removal (COR) processing is considered as a processing capable of removing the natural oxide film in a portion where ions hardly reach. The COR processing is a processing of removing an oxide film by plasmaless dry etching using HF gas and $NH_3$ gas, and is described in, for example, International Publication No. 2007/049510.

SUMMARY

According to a first aspect, the present disclosure provides a method for removing, from a target substrate having an insulating film with a predetermined pattern formed thereon, a silicon-containing oxide film formed in a silicon portion of a bottom of the pattern. The method includes: forming a carbon-based protective film on an entire surface of the insulating film including the pattern by atomic layer deposition (ALD) using a carbon source gas; selectively removing the carbon-based protective film on an upper surface of the insulating film and on the bottom of the pattern by an anisotropic plasma processing; removing the silicon-containing oxide film formed on the bottom of the pattern by etching; and removing a remaining portion of the carbon-based protective film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
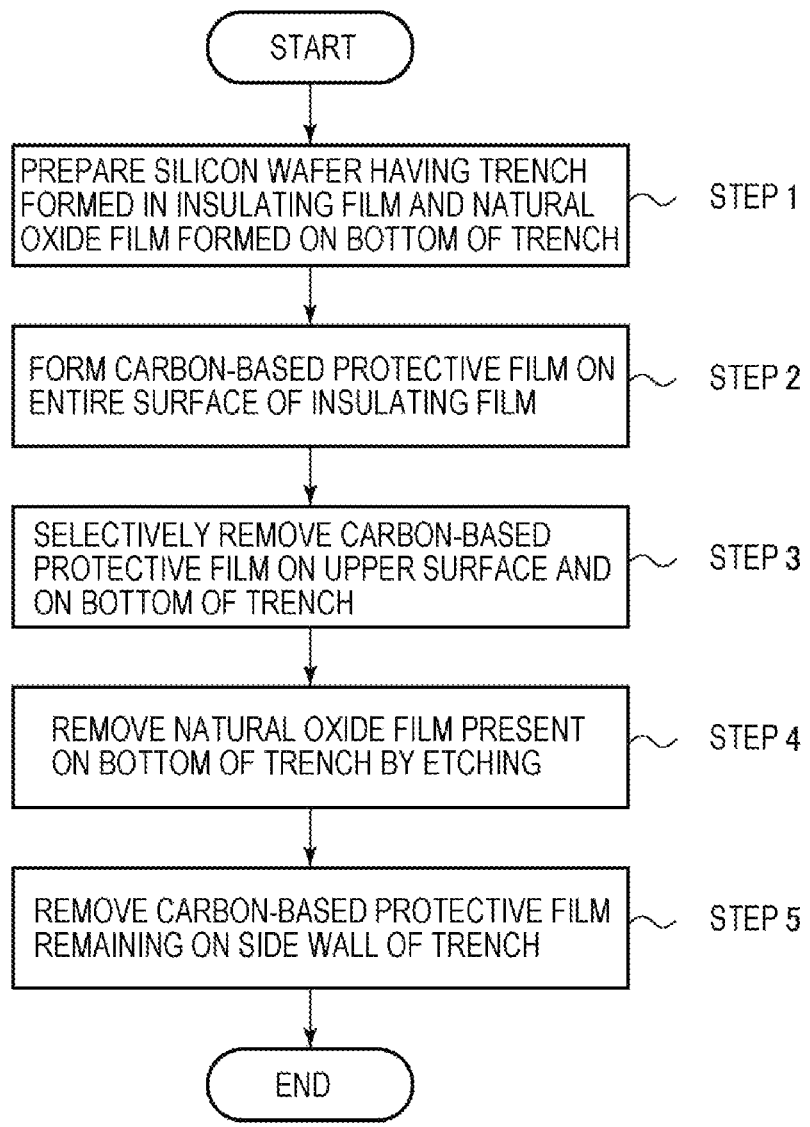
FIG. 1 is a flowchart illustrating an exemplary embodiment of an oxide film removing method according to the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The COR processing is an isotropic processing. Thus, when the COR processing is used for removing a natural oxide film on the bottom of a trench, an insulating film on the side wall of the trench is also etched, resulting in critical dimension (CD) loss. With recent device miniaturization, the width of the insulating film between trenches is required to be smaller than 10 nm. When the insulating film on the side wall of the trench is etched and CD loss occurs, leakage problems may arise. Therefore, it is necessary to suppress the CD loss as much as possible. Further, as the device miniaturization further progresses, the influence of CD loss may not be negligible even when anisotropic etching by ionic etching is used.

Accordingly, an object of the present disclosure is to provide an oxide film removing method and an oxide film removing apparatus capable of suppressing CD loss when removing a silicon-containing oxide film formed on a silicon portion at the bottom of a pattern such as a trench, and a contact forming method and a contact forming system using such an oxide film removing method.

According to a first aspect, the present disclosure provides a method for removing, from a target substrate having an insulating film with a predetermined pattern formed thereon, a silicon-containing oxide film formed in a silicon portion of a bottom of the pattern. The method includes: forming a carbon-based protective film on an entire surface of the insulating film including the pattern by ALD using a carbon source gas; selectively removing the carbon-based protective film on an upper surface of the insulating film and on the bottom of the pattern by an anisotropic plasma processing; removing the silicon-containing oxide film formed on the bottom of the pattern by etching; and removing a remaining portion of the carbon-based protective film.

In the above-described method, the silicon-containing oxide film on the bottom of the pattern may be a natural oxide film formed on a surface of the silicon portion at the bottom of the pattern.

Further, the target substrate may be a substrate for forming a fin-FET and have a silicon fin and an epitaxial growth portion made of Si or SiGe formed at a tip portion of the silicon fin, and the epitaxial growth portion may constitute the silicon portion.

The forming the carbon-based protective film may be performed by alternately repeating a supply of the carbon source gas and a supply of the plasma to repeatedly perform adsorption of the carbon source gas and decomposition of the adsorbed carbon source gas by plasma.

The selectively removing the carbon-based protective film by the anisotropic plasma processing may be performed by argon plasma or hydrogen/nitrogen plasma. Further, the removing the silicon-containing oxide film by etching may be performed by a gas processing using $NH_3$ gas and HF gas. Further, the removing the remaining portion of the carbon-based protective film may be performed by hydrogen plasma.

The method may further include selectively forming the carbon-based protective film on the insulating film on a side wall of the pattern before the forming the carbon-based protective film. Further, the method may further include removing a damaged layer formed in the insulating film due to the removing the remaining portion of the carbon-based protective film after the removing the remaining portion of the carbon-based protective film.

The insulating film may contain a $SiO_2$ film. Further, respective steps of the method may be performed at substantially the same temperature in a range of 30° C. to 150° C. Further, respective steps of the method may be performed continuously in a single processing container.

According to a second aspect, the present disclosure provides an apparatus for removing, from a target substrate having an insulating film with a predetermined pattern formed thereon, a silicon-containing oxide film formed in a silicon portion of a bottom of the pattern. The apparatus includes: a processing container that accommodates the target substrate; a processing gas supply mechanism that supplies a predetermined processing gas into the processing container; an exhaust mechanism that exhausts an atmosphere in the processing container; a plasma generating mechanism that generates plasma in the processing container; and a controller that controls the processing gas supply mechanism, the exhaust mechanism, and the plasma generating mechanism. The controller controls the processing gas supply mechanism, the exhaust mechanism, and the plasma generating mechanism to perform the above-described method.

According to a first aspect, the present disclosure provides a contact forming method including: removing, from a target substrate having an insulating film with a predetermined pattern formed thereon, a silicon-containing oxide film being formed in a silicon portion of a bottom of the pattern by the above-described method; forming a metal film after the silicon-containing oxide film is removed; and forming a contact on the bottom of the pattern by reacting the silicon portion with the metal film.

The forming the metal film is performed by CVD or ALD.

According to a fourth aspect, the present disclosure provides a contact forming system which removes, from a target substrate having an insulating film with a predetermined pattern formed thereon, a silicon-containing oxide film formed in a silicon portion of a bottom of the pattern, and forms a contact in the silicon portion. The contact forming system includes: the above-described apparatus that removes the silicon-containing film of the target substrate; a metal film forming apparatus that forms a metal film after the silicon-containing oxide film is removed; a vacuum conveyance chamber to which the oxide film removing apparatus and the metal film forming apparatus; and a conveyance mechanism provided in the vacuum conveyance chamber.

The metal film forming apparatus may form the metal film by CVD or ALD.

According to a fifth aspect, the present disclosure provides a non-transitory computer-readable storage medium that stores a computer program for controlling an oxide film removing apparatus which, when executed, causes a computer to control the oxide film removing apparatus and execute the above-described method.

According to a sixth aspect, the present disclosure provides a non-transitory computer-readable storage medium that stores a computer program for controlling a contact forming system which, when executed, causes a computer to control the contact forming system and execute the contact forming method.

According to the present disclosure, prior to etching and removing the silicon-containing oxide film formed on the silicon portion at the bottom of the pattern, a carbon-based protective film is formed on the entire surface including the pattern of the insulating film by ALD using a carbon source gas. As a result, the carbon-based protective film may be formed thinly and conformally, and the CD loss during the etching may be reduced without hindering the etching of the silicon-containing oxide film.

Hereinafter, exemplary embodiments of the present disclosure will be described in detail with reference to the drawings.

<Oxide Film Removing Method>

First, an exemplary embodiment of the oxide film removing method of the present disclosure will be described with reference to the flowchart of FIG. 1 and the process sectional views of FIGS. 2A to 2E.

In the exemplary embodiment, descriptions will be made on a case of removing a natural oxide film formed on the surface of a silicon portion in the bottom of a trench formed as a predetermined pattern in a workpiece before forming a contact by depositing a contact metal on the silicon portion.

Figure 2:
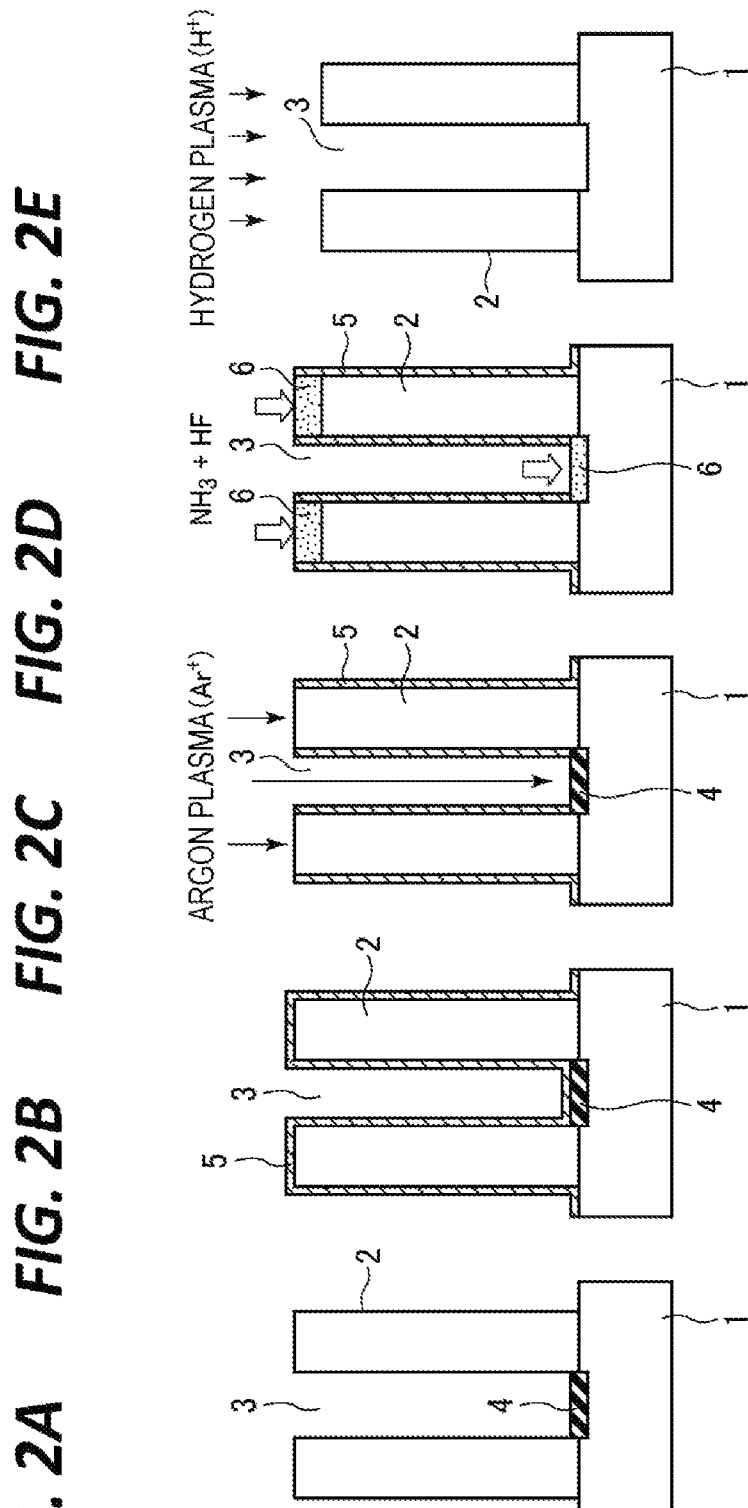
FIGS. 2A to 2E are sectional views illustrating the exemplary embodiment of the oxide film removing method according to the present disclosure step by step.

First, a target substrate (silicon wafer) having an insulating film 2 formed on a silicon base 1 and a trench 3 formed as a predetermined pattern in the insulating film 2 is prepared (step 1; FIG. 2A). A natural oxide film (silicon-containing oxide film) 4 is formed on the silicon portion in the bottom of the trench 3. The insulating film 2 is mainly made of a $SiO_2$ film. A part of the film may be a SiN film.

Figure 3:
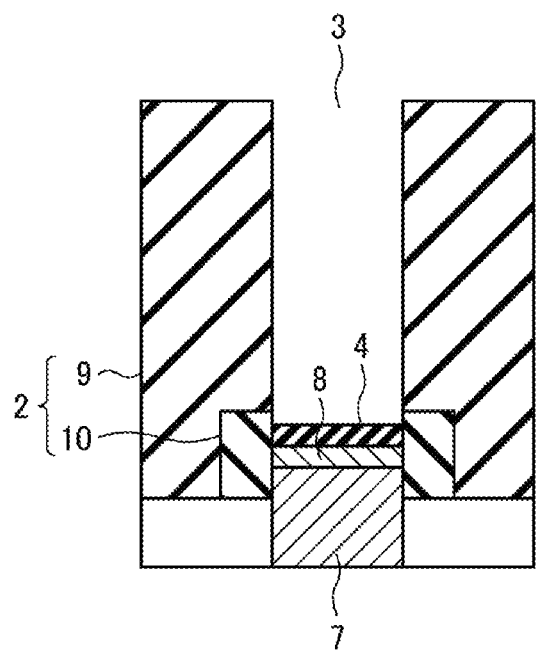
FIG. 3 is a sectional view, taken along a direction orthogonal to a trench, illustrating a structure for forming a fin-FET to which the exemplary embodiment of the oxide film removing method according to the present disclosure is applied.
Figure 4:
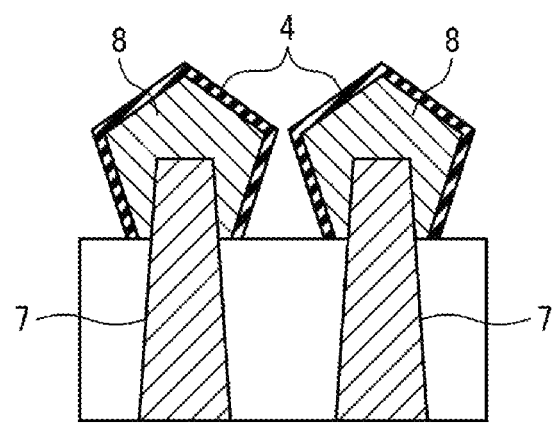
FIG. 4 is a sectional view, taken along a direction of the trench, illustrating a structure for forming a fin-FET to which the exemplary embodiment of the oxide film removing method according to the present disclosure is applied.

The target substrate (silicon wafer) may be, for example, a substrate for forming a fin-FET. FIGS. 3 and 4 are sectional views illustrating an example of the target substrate for forming a fin-FET. FIG. 3 is a sectional view taken along a direction orthogonal to the trench 3, and FIG. 4 is a sectional view taken along the direction of the trench 3. In this example, the target substrate has a polygonal epitaxial growth portion 8 made of Si or SiGe, which is formed as a silicon portion at a tip portion of the Si fin 7, in the bottom portion of the trench 3. The epitaxial growth portion 8 constitutes a source and a drain. In addition, the natural oxide film 4 is formed on the surface of the epitaxial growth portion 8. In this example, the insulating film 2 is made of a $SiO_2$ film 9 which is a main portion, and a SiN film 10 which constitutes a bottom portion. In FIG. 4, the epitaxial growth portion 8 is illustrated as a pentagon, but may be tetragonal.

The trench of the fin-FET has, for example, a top CD of 8 nm to 10 nm, a depth of 100 nm to 120 nm, and an aspect ratio of 12 to 15.

Next, a carbon-based protective film 5 is formed on the entire surface of the insulating film 2 (step 2; FIG. 2B).

The carbon-based protective film 5 has an effect of protecting the insulating film 2 during the subsequent natural oxide film etching step and suppressing film loss (i.e., CD loss) of the insulating film 2.

The carbon-based protective film 5 is formed by atomic layer deposition (ALD) that sequentially supplies carbon source gases. Since a carbon film is able to be formed in an atomic layer-by-layer manner by using ALD, the carbon-based protective film 5 is conformally formed with a thin film thickness of about 2 nm or less, for example, about 1 nm, in a trench having a fine and high aspect ratio.

Figure 5:
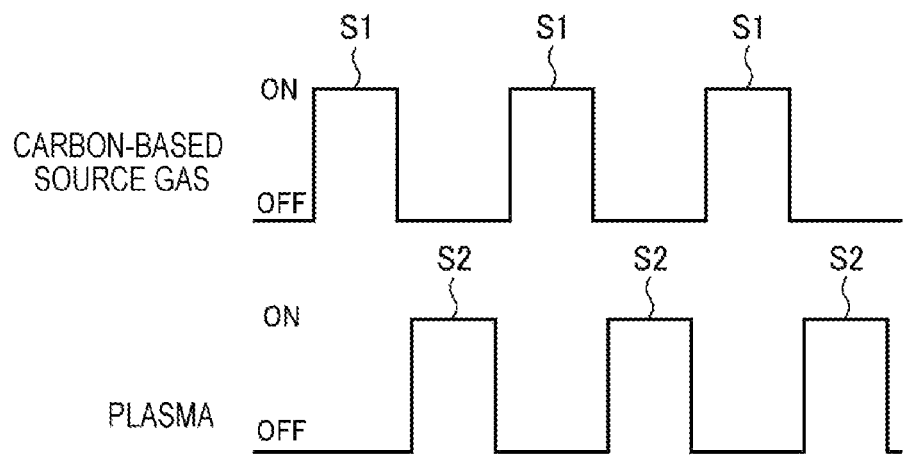
FIG. 5 is a timing chart illustrating an exemplary sequence when forming a carbon-based protective film by ALD.

As illustrated in FIG. 5, the formation of the carbon-based protective film 5 by ALD may be performed by alternately repeating the supply of a carbon source gas (S1) and the supply of plasma (S2). For example, Ar gas may be used as a plasma generating gas.

In this manner, adsorption of the carbon source gas and decomposition of the adsorbed carbon source gas by the plasma are repeatedly performed by alternately repeating the supply of the carbon source gas (S1) and the supply of the plasma (S2). Thus, the carbon-based protective film 5 having a predetermined film thickness may be obtained.

Examples of the carbon source gas may include hydrocarbons ($C_xH_y$) such as, for example, $CH_4$, fluorocarbons ($C_xF_y$) such as, for example, $CF_4$, and fluorinated hydrocarbons ($C_xH_yF_z$) such as, for example, $CH_2F_2$. Among them, fluorinated hydrocarbons tend to be monatomically adsorbed and facilitate conformal film formation because of their polarity.

Figure 6:
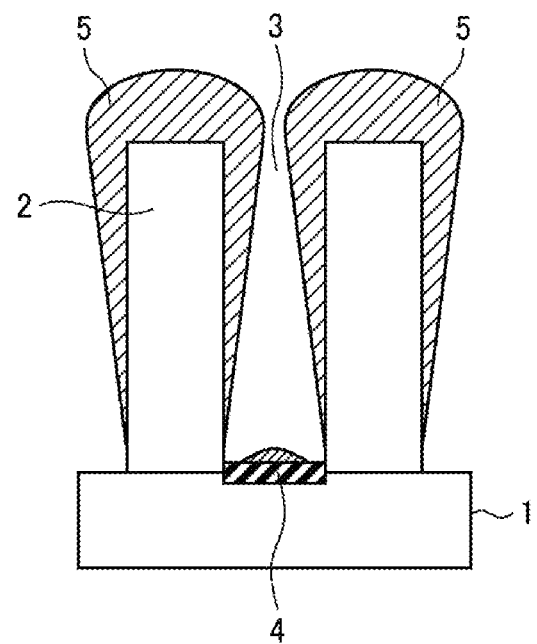
FIG. 6 is a schematic view illustrating a state of film formation when forming a carbon-based protective film by chemical vapor deposition (CVD).

In the case of forming the carbon-based protective film 5 by chemical vapor deposition (CVD), as illustrated in FIG. 6, the carbon source is easily deposited on the opening of the trench 3, and hardly deposited on the bottom, which makes the conformal formation of the carbon-based protective film 5 difficult. Therefore, the opening of the trench 3 becomes narrower. Thus, it becomes difficult for the etching gas to enter the inside of the trench at the time of etching, making it difficult to etch and remove the natural oxide film 4.

When step 2 is performed, the pressure may be about 1 Torr to 2 Torr (133 Pa to 267 Pa), and the temperature may be about 30° C. to 150° C.

Next, the carbon-based protective film 5 on the upper surface of the insulating film 2 and on the bottom of the trench 3 is selectively removed by a processing with anisotropic plasma (step 3; FIG. 2C). As a result, the carbon-based protective film remains only on the side wall of the trench 3.

At this time, the anisotropic plasma processing may be suitably performed by argon plasma. Since Ar ions in the argon plasma have high rectilinearity, it is possible to perform a processing with high anisotropy, and to selectively remove the carbon-based protective film 5 on the upper surface of the insulating film 2 and on the bottom of the trench 3.

The processing with anisotropic plasma may also be performed by hydrogen/nitrogen plasma. Even in hydrogen/nitrogen plasma, it is possible to perform a processing with high anisotropy by causing ions to advance rectilinearly.

When step 3 is performed, the pressure may set to be as low as possible in order to secure the rectilinearity of ions. For example, the pressure is set to about 0.1 Torr (13.3 Pa) or less. In addition, the temperature may be set in a range of about 30° C. to 150° C. as in step 2, and may be set to the same temperature as that in step 2.

Next, the natural oxide film 4 present on the bottom of the trench 3 is removed by etching (step 4; FIG. 2D).

At this time, the etching may be a COR processing which is plasmaless dry etching using $NH_3$ gas and HF gas. Since such gas etching is isotropic etching, it is possible to remove the natural oxide film 4 on the surface of the epitaxial growth portion 8 having a complicated shape on the bottom of the trench of the fin-FET as illustrated in FIG. 4.

In the COR processing, an inert gas such as, for example, Ar gas or $N_2$ gas may be added as a dilution gas in addition to $NH_3$ gas and HF gas.

Conventionally, when the COR processing is used to remove the natural oxide film on the bottom of the trench, the film loss on the side wall portion of the trench occurs, which causes a problem of CD loss. On the other hand, in the exemplary embodiment, since a carbon-based protective film 5, which is non-reactive to the $NH_3$ gas and the HF gas, is formed on the side wall of the trench 3, the upper surface of the insulating film 2, which is the carbon-based protective film removal surface, and the natural oxide film 4 only react with $NH_3$ gas and HF gas and are etched. At this time, a reaction product 6 mainly including ammonium fluorosilicate (($NH_4)_2SiF_6$; AFS) is formed. Since AFS is not generated on the side wall of the trench, there is no concern that the trench 3 is blocked by AFS.

When step 4 is performed, the processing pressure may be about 1 Torr to 2 Torr (133 Pa to 267 Pa). In addition, the temperature may be set in a range of about 30° C. to 150° C. as in steps 2 and 3, and may be set to the same temperature as that in steps 2 and 3.

Next, the carbon-based protective film 5 remaining on the side wall portion of the trench 3 is removed (step 5; FIG. 2E). At this time, the reaction product 6 mainly including AFS is also removed.

When the temperature of step 4 is high to a certain extent, a part of AFS which is a reaction product is vaporized and removed during the processing of step 4.

The removal processing of the carbon-based protective film 5 in step 5 may be performed with hydrogen plasma. The carbon-based film may be removed by plasma of oxygen gas ($O_2$) or ozone ($O_3$). However, when these are used, the bottom of the trench 3 may be reoxidized. Meanwhile, when hydrogen plasma is used, it is possible to remove the carbon-based protective film 5 on the side wall while suppressing reoxidation, by hydrogen ions (H$^+$) and hydrogen radicals (H*) in the plasma.

In the case where hydrogen plasma is used in step 5, the processing pressure may be low to some extent because it is a removal processing by plasma, but rectilinearity of ions as in step 2 is not required. Therefore, the processing pressure in step 5 may be about 0.5 Torr (66.5 Pa) or less. In addition, the processing temperature may be set in a range of about 30° C. to 150° C. as in steps 2 to 4, and may be set to the same temperature as that in steps 2 to 4.

As described above, in the exemplary embodiment, since the carbon-based protective film 5 is formed on the inner wall of the trench 3 by ALD prior to the etching of the natural oxide film (SiO$_2$ film) 4 of the bottom of the trench 3, the carbon-based protective film 5 may be formed thinly and conformally. Therefore, when the natural oxide film of the bottom of the trench 3 is etched, the carbon-based protective film 5 does not hinder the etching gas from reaching the bottom of the trench 3, and the side wall of the insulating film 2 is suppressed from being etched by the carbon-based protective film 5. Thus, the CD loss may be reduced.

In particular, in the case where the source and the drain, which are the semiconductor portions of the bottom of the trench 3, have complicated shapes like the structure for forming the fin-FET, the CD loss may be reduced due to the presence of the carbon-based protective film 5 even when the COR processing, which is an isotropic etching process effective for removing the natural oxide film formed on the portion, is used.

In addition, when steps 2 to 5 are performed at the same temperature, the natural oxide film may be processed in a short time, and the throughput may be kept high.

Steps 1 to 5 are basic steps, but the following steps may be added as additional steps.

Figure 7:
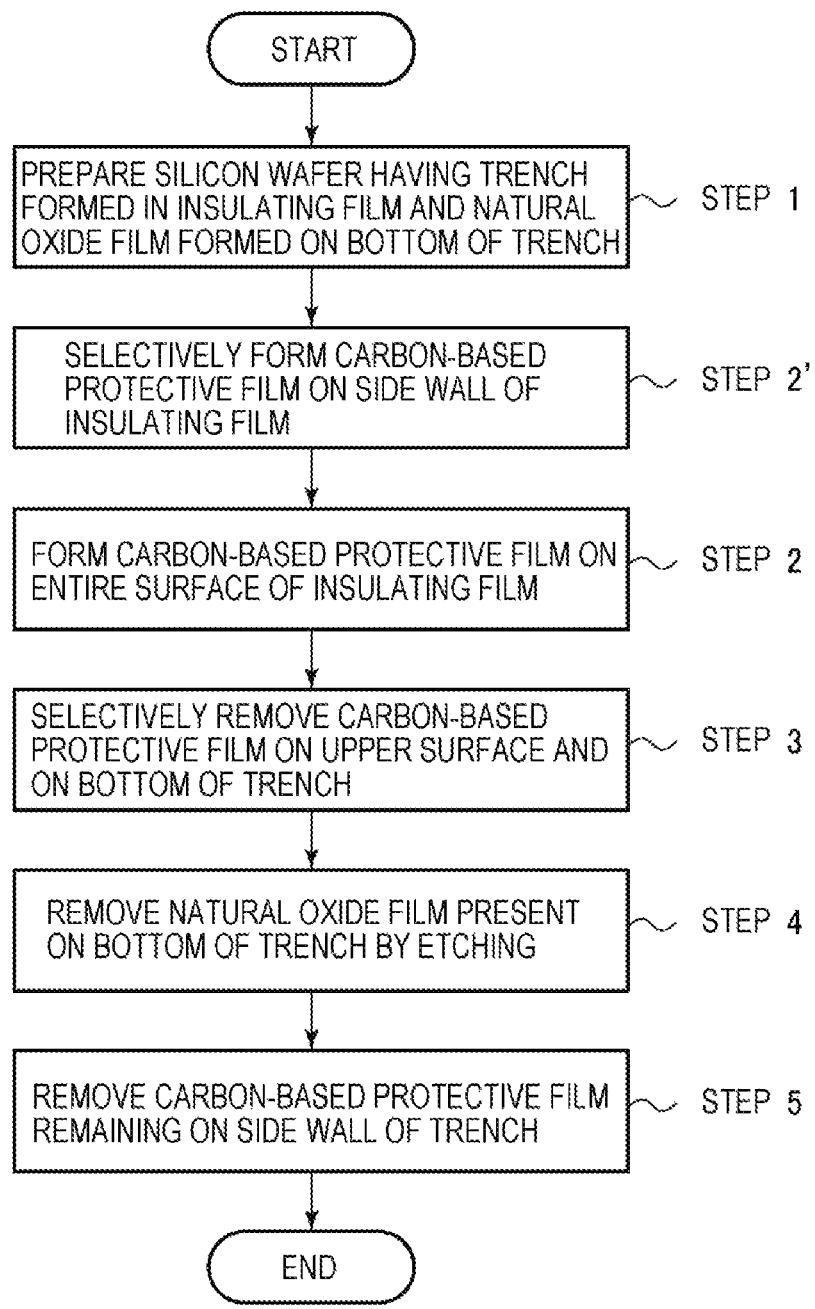
FIG. 7 is a flowchart illustrating another exemplary embodiment of the oxide film removing method according to the present disclosure.

For example, since the carbon-based protective film 5 on the upper surface of the insulating film 2 and on the bottom of the trench 3 is removed thereafter, as illustrated in FIG. 7, a processing step for selectively forming a carbon-based protective film on the insulating film 2 portion of the side wall of the trench 3 may be performed as step 2' prior to the formation of the carbon-based protective film 5 in step 2. As such a processing, a plasma processing may be mentioned. The plasma processing makes it possible to perform an anisotropic processing of processing only the upper surface of the insulating film 2 and the bottom of the trench 3 and to form the carbon-based protective layer thick only on the side wall of the insulating film 2.

Figure 8:
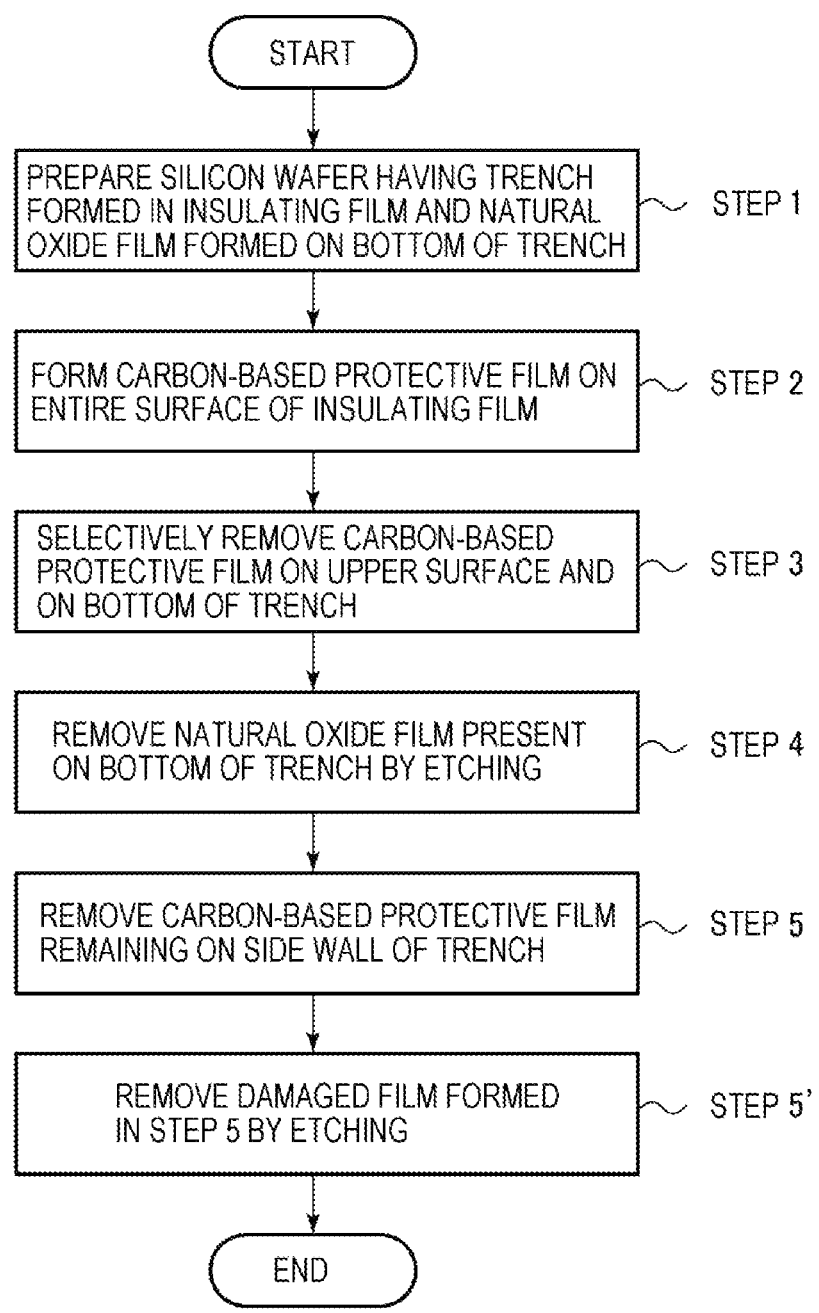
FIG. 8 is a flowchart illustrating still another exemplary embodiment of the oxide film removing method according to the present disclosure.

In addition, there is a case where a plasma damaged layer is formed in the insulating film 2 in the hydrogen plasma processing in step 5. However, in that case, as illustrated in FIG. 8, after step 5, step 5' of removing the damaged layer by the same etching processing as in step 4 may be performed. The etching in step 5' is to remove the plasma damaged layer, and is performed sufficiently within a short time. Therefore, reduction in thickness of the side wall of the trench due to the etching in step 5' hardly occurs.

Both steps 2' and 5' may be added to steps 1 to 5.

<Contact Forming Method>

Figure 9:
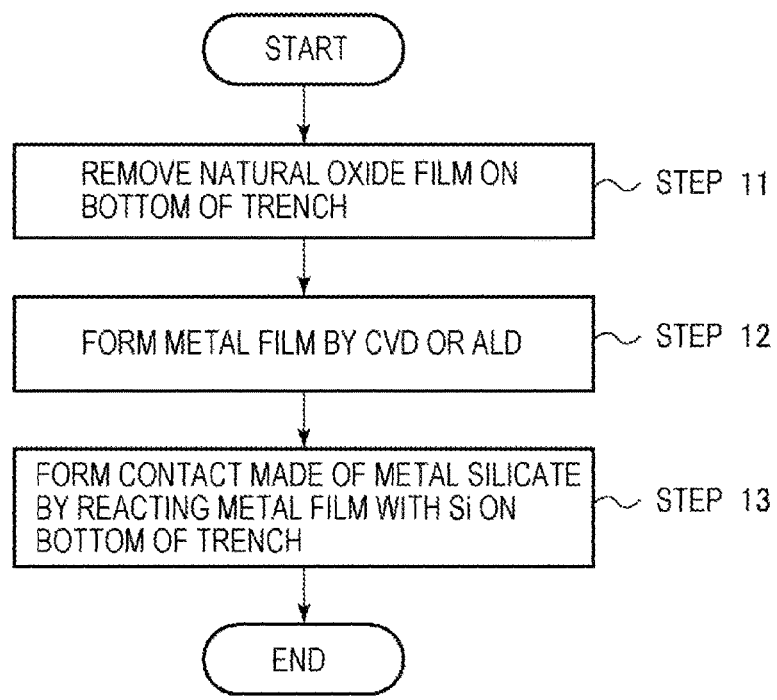
FIG. 9 is a flowchart illustrating an exemplary embodiment of a contact forming method.

Next, an exemplary embodiment of a contact forming method will be described with reference to the flowchart of FIG. 9 and the process sectional views of FIGS. 10A to 10C.

Figure 10A:
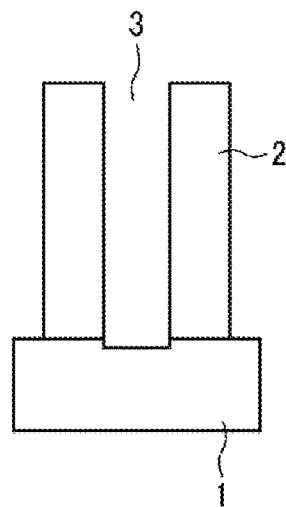
FIGS. 10A to 10C are sectional views illustrating an exemplary embodiment of the contact forming method step by step.
Figure 10B:
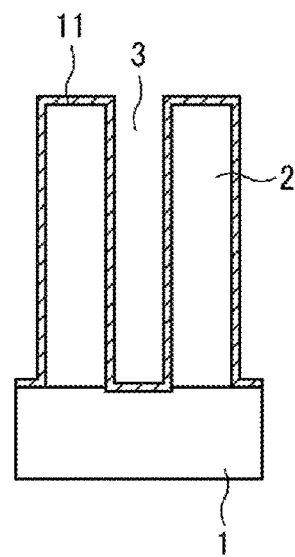

In the contact forming method according to the exemplary embodiment, by steps 1 to 5 or the process of adding the step 2' and/or step 5' to steps 1 to 5, the natural oxide film on the bottom of the trench 3 is removed as illustrated in FIG. 10A (step 11), and then, a metal film 11 is formed as a contact metal by CVD or ALD as illustrated in FIG. 10B (step 12). Examples of the metal film include a Ti film and a Ta film.

Figure 10C:
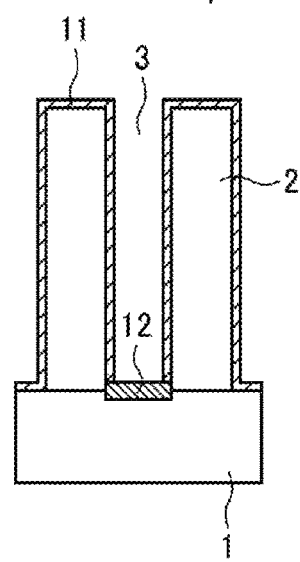

Then, as illustrated in FIG. 10C, the metal film 11 reacts with silicon on the bottom of the trench 3 so that a contact 12 made of metal silicate (e.g., TiSi) is formed in a self-aligning manner (step 13).

<Oxide Film Removing Method>

Figure 11:
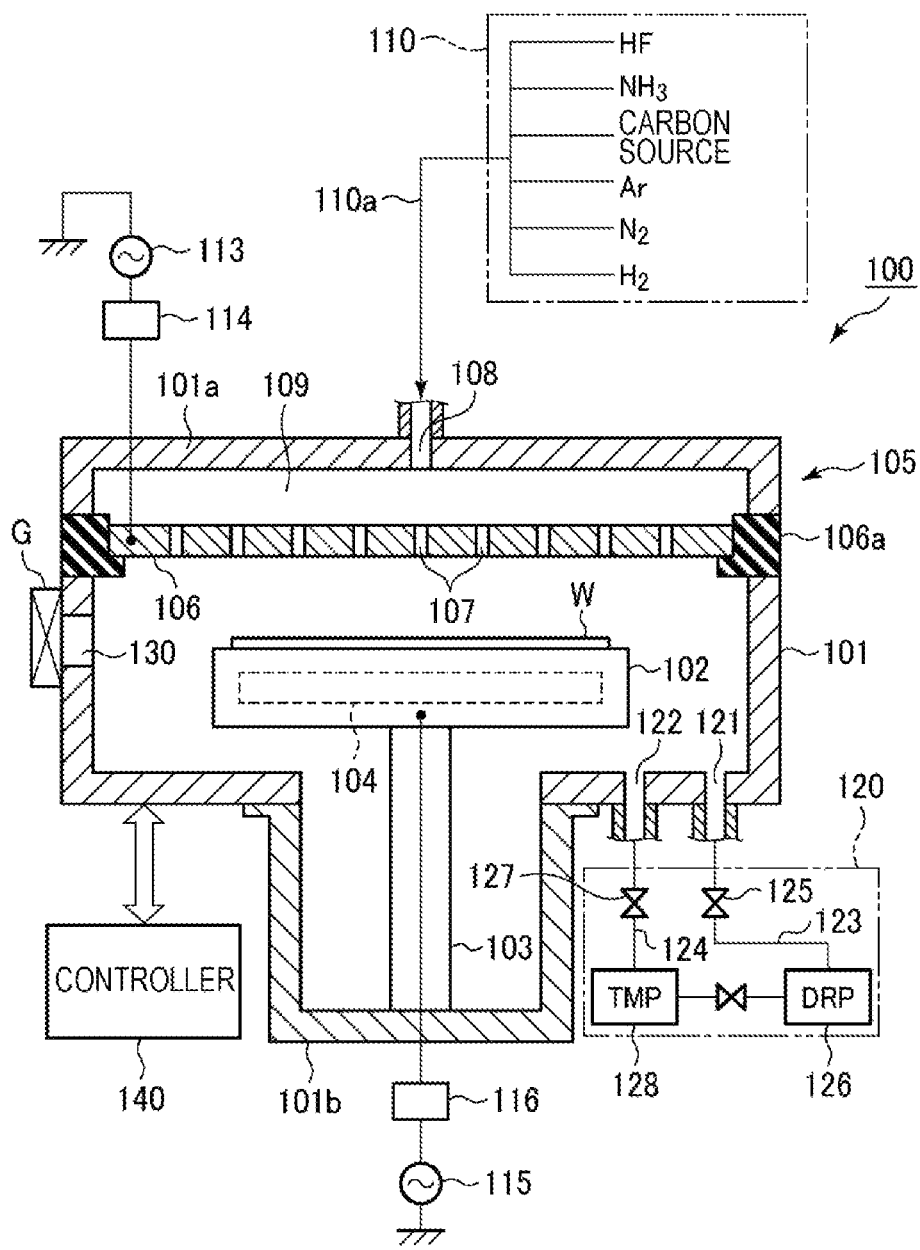
FIG. 11 is a sectional view illustrating an exemplary oxide film removing apparatus.

Next, an example of an oxide film removing apparatus used for performing the oxide film removing method will be described. FIG. 11 is a sectional view illustrating an exemplary oxide film removing apparatus.

The oxide film removing apparatus 100 includes a substantially cylindrical chamber (processing container) 101. The inner wall surface of the chamber 101 is made of, for example, aluminum which is subjected to an out gas-free (OGF) anodic oxidation treatment.

A susceptor 102 is provided inside the chamber 101 in a state of being supported by a cylindrical support member 103 provided in the lower central portion to horizontally support a silicon wafer (target substrate) W which is a structure in which the structure illustrated in FIG. 2A is formed on the entire surface. An opening is formed in the center of the bottom portion of the chamber 101, and a cylindrical protruding portion 101b is connected to the lower portion of the opening portion. The support member 103 is supported by the bottom portion of the protruding portion 101b.

For example, the main body of the susceptor 102 is made of aluminum, and an insulating ring (not illustrated) is formed on the outer periphery thereof. A temperature adjustment mechanism 104 is provided inside the susceptor 102 to adjust the temperature of the silicon wafer W thereon. For example, the temperature adjustment mechanism 104 adjusts the temperature of the silicon wafer W to a proper temperature in a range of, for example, 30° C. to 150° C. by allowing the temperature-controlled temperature adjustment medium to flow through the flow path formed in the susceptor 102.

Three lift pins (not shown) for conveying the silicon wafer W are provided in the susceptor 102 so as to protrude and retract from the surface of the susceptor 102. An electrostatic chuck may be provided on the upper surface of the susceptor 102 to electrostatically attract the silicon wafer W.

A shower head 105 is provided in the upper portion of the chamber 101. The shower head 105 has a shower plate 106 having a disc shape and provided with a plurality of gas ejection holes 107, which are provided right under the top wall 101a of the chamber 101. The shower plate 106 used herein may be, for example, one in which a thermal spray coating made of yttria is formed on the surface of the main body made of aluminum. The shower plate 106 and the chamber 101 are insulated by a ring-shaped insulating member 106a.

A gas introduction port 108 is provided at the center of the top wall 101a of the chamber 101, and a gas diffusion space 109 is defined between the top wall 101a and the shower plate 106.

The gas introduction port 108 is connected with a gas pipe 110a of a gas supply mechanism 110. Then, the gas supplied from the gas supply mechanism 110 (to be described later) is introduced from the gas introduction port 108, is diffused into the gas diffusion space 109, and is ejected into the chamber 101 from the gas discharge holes 107 of the shower plate 106.

The gas supply mechanism 110 includes a plurality of gas supply sources that individually supplies HF gas, NH$_3$ gas, a carbon source gas, Ar gas, N$_2$ gas, and H$_2$ gas, and a plurality of gas supply pipes that supply respective gases from the plurality of gas supply sources (all not illustrated). Each gas supply pipe is provided with an opening/closing valve and a flow rate controller (e.g., a mass flow controller) (all of which are not illustrated), which make it possible to appropriately switch the gases and control the flow rate of each gas. The gases from the gas supply pipes are supplied to the shower head 105 via the gas pipe 110a described above.

A first high-frequency power supply 113 is connected to the shower plate 106 via a matcher 114, and high-frequency power is applied to the shower plate 106 from the first high-frequency power supply 113. The shower plate 106 functions as an upper electrode, and the susceptor 102 functions as a lower electrode, thereby constituting a pair of parallel plate electrodes. When high-frequency power is applied to the shower plate 106, capacitively coupled plasma is generated in the chamber 101. The frequency of the high-frequency power output from the first high-frequency power supply 113 may be set to 450 kHz to 13.56 MHz, for example, 450 kHz.

Meanwhile, a second high-frequency power supply 115 is connected to the shower plate 102 via a matcher 116, and high-frequency power for bias is applied to the shower plate 102 from the second high-frequency power supply 115. Ions in the plasma are drawn into the silicon wafer W by applying bias high-frequency waves to the susceptor 102.

An exhaust mechanism 120 is provided in the upper portion of the chamber 101. The exhaust mechanism 120 includes a first exhaust pipe 123 and a second exhaust pipe 124 provided in the exhaust ports 121 and 122 formed in the bottom of the chamber 101, respectively, a first pressure control valve 125 and a dry pump 126 provided in the first exhaust pipe 123, and a second pressure control valve 127 and a turbo pump 128 provided in the second exhaust pipe 124. Further, during the film formation processing in which the inside of the chamber 101 is set to a high pressure, the dry pump 126 alone exhausts the gas, and during the plasma processing in which the inside of the chamber 101 is set to a low pressure, the dry pump 126 and the turbo pump 128 are used in combination. The pressure control in the chamber 101 is performed by controlling the opening degree of the pressure control valves 125 and 127 based on the detection value of a pressure sensor (not illustrated) provided in the chamber 101.

The side wall of the chamber 101 is provided with a carry-in/out port 130 through which a silicon wafer W is carried into/from a vacuum conveyance chamber (not shown) to which the chamber 101 is connected, and a gate valve G that opens and closes the carry-in/out port 130. The conveyance of the silicon wafer W is performed by a conveyance mechanism (not illustrated) provided in the vacuum conveyance chamber.

The oxide film removing apparatus 100 includes a controller 140. The controller 140 includes a main controller having a CPU (computer) that controls respective components of the oxide film removing apparatus 100, for example, a valve or a mass flow controller of the gas supply mechanism, the high-frequency power sources 113 and 115, the exhaust mechanism 120, the temperature adjustment mechanism 104, the conveyance mechanism, and the gate valve G, an input device (e.g., a keyboard and a mouse), an output device (e.g., a printer), a display device (e.g., a display), and a storage device (e.g., a storage medium). The main controller of the controller 140 causes the oxide film removing apparatus 100 to execute a predetermined operation based on a processing recipe stored in the storage medium built in the storage device or a storage medium set in the storage device.

Next, the processing operation of the oxide film removing apparatus configured as described above will be described. The following processing operation is executed based on the processing recipe stored in the storage medium in the controller 140.

First, the gate valve G is opened, and a silicon wafer W, which is a structure in which the structure illustrated in FIG. 2A is formed on the entire surface, is carried from a vacuum conveyance chamber (not illustrated) via a carry-in/out port 130 by a conveyance mechanism (not illustrated) and placed on the susceptor 102. In this state, the conveyance mechanism is retreated from the chamber 101, and the gate valve G is closed.

Next, the pressure in the chamber 101 is adjusted to a predetermined value within a range of 1 Torr to 2 Torr (133 Pa to 267 Pa) by the exhaust mechanism 120, and the temperature of the silicon wafer W (the temperature of the susceptor 102) is adjusted to a predetermined value in a range of 30° C. to 150° C. by the temperature adjustment mechanism 104 of the susceptor 2. At this time, since the pressure in the chamber 101 is relatively high, it is possible to exhaust with only the dry pump 126.

In this state, a carbon source gas such as, for example, hydrocarbon ($C_xH_y$) (e.g., CH$_4$), fluorocarbon ($C_xF_y$) CF$_4$), or fluorinated hydrocarbon ($C_xH_yF_z$) (e.g., CH$_2$F$_2$) is sequentially supplied from the gas supply mechanism 110 into the chamber 101 via the shower head at a predetermined flow rate, and a carbon-based protective film is formed on the silicon wafer W by ALD. Specifically, the supply of the carbon source gas and the generation of plasma by the first high-frequency power supply 113 are alternately repeated while Ar gas is continuously supplied at a predetermined flow rate. Adsorption of the carbon source gas and decomposition of the adsorbed carbon source gas by plasma are repeatedly performed to form a conformal carbon-based protective film with a thin film thickness of 1 nm to 2 nm. At this time, while the first high-frequency power supply 113 is turned on, the second high-frequency power supply 115 may be turned on for ion attraction.

After the carbon-based protective film is formed, the inside of the chamber 101 is purged with Ar gas while being exhausted by the exhaust mechanism 120.

After the purge is completed, the pressure in the chamber 101 is adjusted to a low pressure of 0.1 Torr (13.3 Pa) or less by the exhaust mechanism 120 while maintaining the silicon wafer W at the same temperature. Then, while the Ar gas is supplied from the gas supply mechanism 110 into the chamber 101 via the shower head 105 at a predetermined flow rate, the first high-frequency power supply 113 and the second high-frequency power supply 115 are turned on. At this time, since the pressure in the chamber 101 is low, the inside of the chamber 101 is exhausted by using the turbo pump 128 in addition to the dry pump 126.

As a result, argon plasma is generated in the chamber 101, and Ar ions (Ar$^+$) in the plasma are attracted into the silicon wafer W by the high-frequency bias applied to the susceptor 102. Thus, Ar ions advance rectilinearly and act on the surface of the silicon wafer, and an anisotropic plasma processing is performed to selectively remove the carbon-based protective film on the upper surface of the insulating film of the silicon wafer W and on the bottom of the trench. The anisotropic plasma processing may be performed by introducing H$_2$ gas and N$_2$ gas into the chamber 101 to generate H$_2$/N$_2$ plasma.

After the anisotropic plasma processing, the inside of the chamber 101 is purged with Ar gas or $N_2$ gas while being exhausted by the exhaust mechanism 120.

After the purge is completed, the pressure in the chamber 101 is adjusted to a predetermined pressure within a range of 1 Torr to 2 Torr (133 Pa to 267 Pa) by the exhaust mechanism 120 while maintaining the silicon wafer W at the same temperature. Then, $NH_3$ gas and HF gas are supplied from the gas supply mechanism 110 into the chamber 101 via the shower head 105 at predetermined flow rates. At least one of the $N_2$ gas and the Ar gas may be supplied as a dilution gas together with the $NH_3$ gas and the HF gas. At this time, since the pressure in the chamber 101 is relatively high, it is possible to exhaust with only the dry pump 126.

As a result, the natural oxide film on the bottom of the trench is removed. Since the processing at this time is a gas processing without using plasma, isotropic etching may be performed, and even a natural oxide film formed in a complicatedly shaped silicon region may be effectively removed. Further, since the carbon-based protective film is formed on the side wall of the trench, CD loss is suppressed.

After the etching processing of the natural oxide film, the inside of the chamber 101 is purged with Ar gas while being exhausted by the exhaust mechanism 120.

After the purge is completed, the pressure in the chamber 101 is adjusted to 0.5 Torr (665 Pa) or less by the exhaust mechanism 120 while maintaining the silicon wafer W at the same temperature. Then, while the $H_2$ gas is supplied from the gas supply mechanism 110 into the chamber 101 via the shower head 105 at a predetermined flow rate, the first high-frequency power supply 113 is turned on to perform a hydrogen plasma processing. At this time, since the pressure in the chamber 101 is relatively low, the turbo pump 128 is used in addition to the dry pump 126. Further, in addition to $H_2$ gas, Ar gas may be supplied as the processing gas. Further, the second high-frequency power supply 115 may be turned on for ion attraction.

The carbon-based protective film remaining on the side wall of the trench is removed by the hydrogen plasma processing.

After the hydrogen plasma processing, the inside of the chamber 101 is purged with $N_2$ gas, and the gate valve G is opened so that the silicon wafer W on the susceptor 102 is carried out by the conveyance mechanism.

By a series of the processings described above, it is possible to securely remove the natural oxide film at the bottom of the trench while suppressing the CD loss.

In addition, since the series of processings described above is performed continuously in the chamber 101, the processings may be performed with high efficiency. Further, since the series of processings is performed at the same temperature, the processing time may be shortened, and high throughput may be obtained.

In the oxide film removing apparatus 100, an anisotropic processing may be performed by a plasma processing such as, for example, an argon plasma processing prior to the formation of the carbon-based protective film. In addition, a processing of etching and removing the plasma damaged layer with $NH_3$ gas and HF gas may be performed after the hydrogen plasma processing.

<Contact Forming System>

Next, descriptions will be made on a contact forming system including the oxide film removing apparatus 100.

Figure 12:
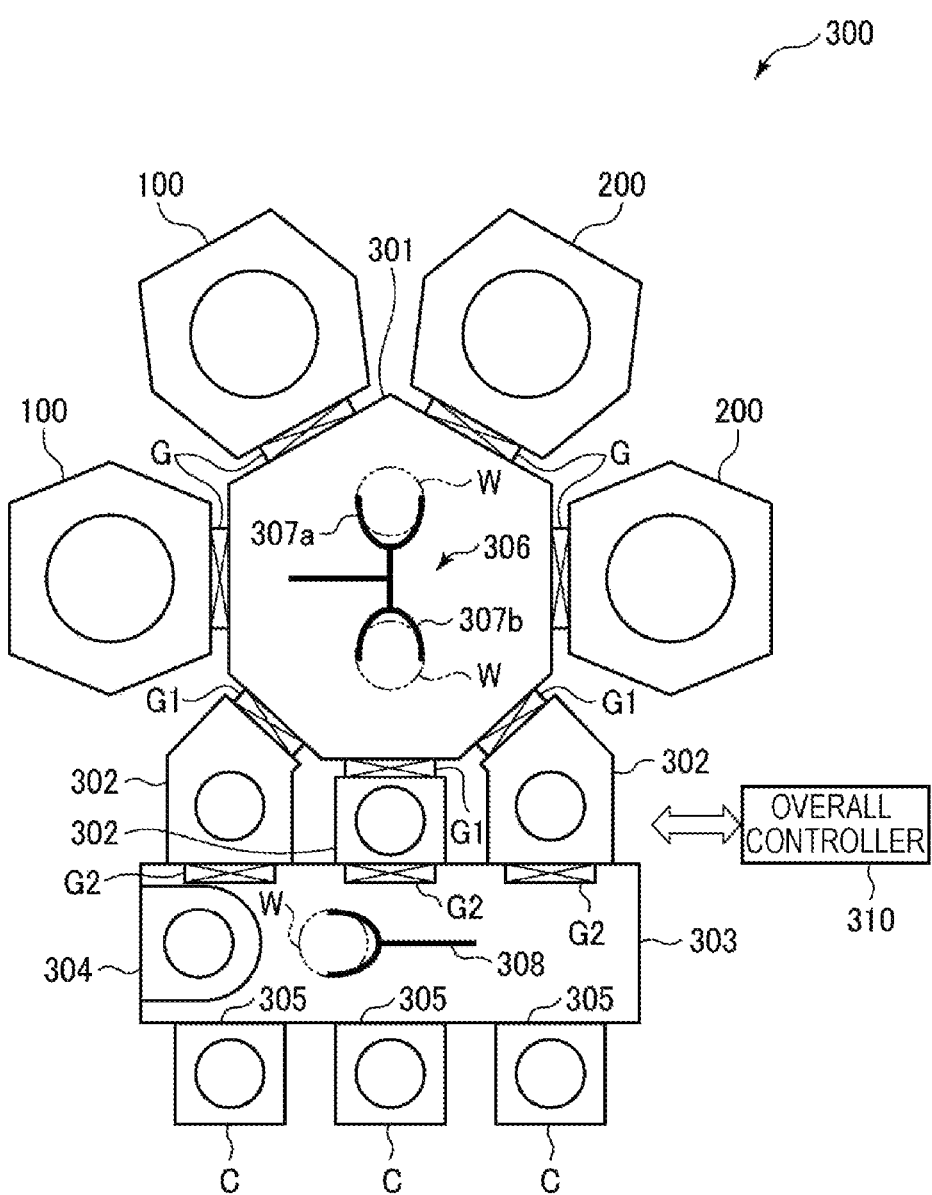
FIG. 12 is a horizontal sectional view schematically illustrating a contact forming system including the oxide film removing apparatus.

FIG. 12 is a horizontal sectional view schematically illustrating a contact forming system.

The contact forming system 300 performs the oxide film removing process described above, and then forms a contact by forming, for example, a Ti film as a contact metal.

As illustrated in FIG. 12, the contact forming system 300 includes two oxide film removing apparatuses 100 and two metal film forming apparatuses 200. These are connected to four wall portions of a vacuum conveyance chamber 301 having a heptagonal planar shape via the gate valves G, respectively. The inside of the vacuum conveyance chamber 301 is evacuated by a vacuum pump and maintained at a predetermined degree of vacuum.

The oxide film removing apparatus 100 is configured as described above. The metal film forming apparatus is, for example, an apparatus for forming a metal film, for example, a Ti film or a Ta film on a silicon wafer W by CVD or ALD within a chamber in a vacuum atmosphere.

In addition, three load lock chambers 302 are connected to the other three wall portions of the vacuum conveyance chamber 301 via gate valves G1. An atmospheric conveyance chamber 303 is provided at the opposite side of the vacuum conveyance chamber 301 across the load lock chambers 302. The three load lock chambers 302 are connected to the atmospheric conveyance chamber 303 via the gate valves G2. The load lock chamber 302 controls the pressure between the atmospheric pressure and the vacuum when the silicon wafer W is conveyed between the atmospheric conveyance chamber 303 and the vacuum conveyance chamber 301.

In the wall of the atmospheric conveyance chamber 303 on the side opposite to the load lock chamber 302 mounting wall portion, three carrier mounting ports 305 are provided to mount a carrier (e.g., a FOUP) C that accommodates a wafer W. In addition, an alignment chamber 304 is provided on the side wall of the atmospheric conveyance chamber 303 to align the silicon wafer W. A downflow of clean air is formed in the atmospheric conveyance chamber 303.

A conveyance mechanism 306 is provided in the vacuum conveyance chamber 301. The conveyance mechanism 306 conveys the silicon wafer W to the oxide film removing apparatuses 100, the metal film forming apparatuses 200, and the load lock chambers 302. The conveyance mechanism 306 includes two conveyance arms 307a and 307b that are movable independently.

A conveyance mechanism 308 is provided in the atmospheric conveyance chamber 303. The conveyance mechanism 308 is configured to convey the silicon wafer W to the carriers C, the load lock chambers 302, and the alignment chamber 304.

The contact forming system 300 includes an overall controller 310. The overall controller 310 includes a main controller having a CPU (computer) that controls, for example, the respective components of the oxide film removing apparatus 100 and the metal film forming apparatus 200, the exhaust mechanism or the conveyance mechanism 306 of the vacuum conveyance chamber 301, the exhaust mechanism or the gas supply mechanism of the load lock chamber 302, the conveyance mechanism 308 of the atmospheric conveyance chamber 303, and the driving mechanism of the gate valves G, G1, G2, an input device (e.g., a keyboard and a mouse), an output device (e.g., a printer), a display device (e.g., a display), and a storage device (e.g., a storage medium). The main controller of the overall controller 310 causes the contact forming system 300 to execute a predetermined operation based on a processing recipe stored in the storage medium built in the storage device or a storage medium set in the storage device. The overall control unit 310 may be a high-ranking controller of the controller of each unit such as the controller 140.

Next, the processing operation of the contact forming apparatus configured as described above will be described. The following processing operation is executed based on the processing recipe stored in the storage medium in the overall controller 310.

First, the silicon wafer W is taken out from the carrier C connected to the atmospheric conveyance chamber 303 by the conveyance mechanism 308, and the gate valve G2 of any one of the load lock chambers 302 is opened so that the silicon wafer W is carried into that load lock chamber 302. The gate valve G2 is closed, and then the inside of the load lock chamber 302 is evacuated.

When the load lock chamber 302 reaches a predetermined degree of vacuum, the gate valve G1 is opened to take out the silicon wafer W from the load lock chamber 302 by one of the conveyance arms 307a, 307b of the conveyance mechanism 306.

Then, the gate valve G of any one of the oxide film removing apparatuses 100 is opened, and the silicon wafer W held by any of the conveyance arms of the conveyance mechanism 306 is carried into the oxide film removing apparatus 100. The empty conveyance arm is returned to the vacuum conveyance chamber 301, and the gate valve G is closed. Then, the oxide film removing processing is performed by the oxide film removing apparatus 100.

After the oxide film removing processing is completed, the gate valve G of the oxide film removing apparatus 100 is opened, and the silicon wafer W therein is carried out by one of the conveyance arms 307a, 307b of the conveyance mechanism 306. Then, the gate valve G of any one of the metal film forming apparatuses 200 is opened, and the silicon wafer W held by the conveyance arm is carried into the metal film forming apparatus 200. The empty conveyance arm is returned to the vacuum conveyance chamber 301, and the gate valve G is closed. Then, a metal film to be a contact metal (e.g., a Ti film or a Ta film) is formed by the metal film forming apparatus 200 by CVD or ALD. At this time, the metal film reacts with silicon at the bottom of the trench to form a contact made of a metal silicate (e.g., TiSi).

After the formation of the metal film and the contact formation, the gate valve G of the metal film forming apparatus 200 is opened, and the silicon wafer W therein is carried out by one of the conveyance arms 307a, 307b of the conveyance mechanism 306. Then, the gate valve G1 of one of the load lock chambers 302 is opened, and the silicon wafer W on the conveyance arm is carried into the load lock chamber 302. Then, the inside of the load lock chamber 302 is returned to the atmosphere. The gate valve G2 is opened, and the silicon wafer W in the load lock chamber 302 is returned to the carrier C by the conveyance mechanism 308.

The above processing is performed on a plurality of silicon wafers W concurrently in parallel, and the contact forming processing for a predetermined number of silicon wafers W is completed.

As described above, in the oxide film removing apparatus 100, the formation of the carbon-based protective film, the removal of the carbon-based protective film on the bottom of the trench, the removal of the natural oxide film by etching, and the removal of the remaining carbon-based protective film are efficiently performed in one chamber. Thus, it is possible to implement the contact forming system 300 in which two oxide film removing apparatuses 100 and two metal film forming apparatuses 200 are mounted. In addition, the contact forming system 300 makes it possible to implement the processings of the oxide film removal and the contact formation by metal film formation with high throughput.

OTHER APPLICATIONS

Although the exemplary embodiment of the present disclosure has been described above, the present disclosure is not limited to the above-described exemplary embodiment and may be variously modified.

For example, in the above exemplary embodiment, descriptions have been made on the case where the present disclosure is used for removing the natural oxide film in the contact portion at the bottom of the trench of the fin-FET. However, the present disclosure is not limited thereto and may be applied to removal of the oxide film formed at the bottom of the fine pattern. Although the trench is exemplified as a pattern, the pattern is not limited to the trench, but may be another form such as, for example, a via hole.

In addition, in the above exemplary embodiment, a gas processing capable of performing isotropic etching is exemplified as an etching processing for removing an oxide film, but the present disclosure is also applicable to anisotropic etching using plasma. Since CD loss occurs even in the plasma etching, the present disclosure is effective.

Further, in the above exemplary embodiment, descriptions have been made on an example in which argon plasma processing is used for removing the carbon-based protective film at the bottom of the trench after forming the carbon-based protective film, but the present disclosure is not limited thereto as long as it is a removal processing with high anisotropy.

Furthermore, in the above exemplary embodiment, descriptions have been made on the example in which the carbon-based protective film remaining after the removal of the oxide film is removed using hydrogen plasma, but the present disclosure is not limited thereto. For example, oxygen plasma or ozone may be used when the possibility of reoxidation is low after removing the oxide film.

Further, in the above exemplary embodiment, a silicon wafer is used as the target substrate, but, the present disclosure is not limited thereto. Any substrate such as, for example, a compound semiconductor, a glass substrate, or a ceramic substrate may be used as long as the silicon-containing oxide film is present at the bottom of the trench.

From the foregoing, it will be appreciated that various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for removing, from a target substrate having an insulating film with a predetermined pattern formed thereon, a silicon-containing oxide film formed in a silicon portion of a bottom of the pattern, the method comprising:
   forming a carbon-based protective film on an entire surface of the insulating film including the pattern by ALD using a carbon source gas;
   selectively removing the carbon-based protective film on an upper surface of the insulating film and on the bottom of the pattern by an anisotropic plasma processing;
   removing the silicon-containing oxide film formed on the bottom of the pattern by etching; and removing a remaining portion of the carbon-based protective film.

2. The method of claim 1, wherein the silicon-containing oxide film on the bottom of the pattern is a natural oxide film formed on a surface of the silicon portion of the bottom of the pattern.

3. The method of claim 2, wherein the target substrate is a substrate for forming a fin-FET and has a silicon fin and an epitaxial growth portion made of Si or SiGe formed at a tip portion of the silicon fin, and the epitaxial growth portion constitutes the silicon portion.

4. The method of claim 1, wherein the forming the carbon-based protective film is performed by alternately repeating a supply of the carbon source gas and a supply of the plasma to repeatedly perform adsorption of the carbon source gas and decomposition of the adsorbed carbon source gas by plasma.

5. The method of claim 1, wherein the selectively removing the carbon-based protective film by the anisotropic plasma processing is performed by argon plasma or hydrogen/nitrogen plasma.

6. The method of claim 1, wherein the removing the silicon-containing oxide film by etching is performed by a gas processing using $NH_3$ gas and HF gas.

7. The method of claim 1, wherein the removing the remaining portion of the carbon-based protective film is performed by hydrogen plasma.

8. The method of claim 1, further comprising:
selectively forming the carbon-based protective film on the insulating film on a side wall of the pattern before the forming the carbon-based protective film.

9. The method of claim 1, further comprising:
removing a damaged layer formed in the insulating film due to the removing the remaining portion of the carbon-based protective film after the removing the remaining portion of the carbon-based protective film.

10. The method of claim 1, wherein the insulating film contains a $SiO_2$ film.

11. The method of claim 1, wherein respective steps of the method are performed at substantially the same temperature in a range of 30° C. to 150° C.

12. The method of claim 1, wherein respective steps of the method are performed continuously in a single processing container.

13. A contact forming method comprising:
removing, from a target substrate having an insulating film with a predetermined pattern formed thereon, a silicon-containing oxide film formed in a silicon portion of a bottom of the pattern by the method of claim 1;
forming a metal film after the silicon-containing oxide film is removed; and
forming a contact on the bottom of the pattern by reacting the silicon portion with the metal film.

14. The contact forming method of claim 13, wherein the forming the metal film is performed by CVD or ALD.

* * * * *